(12) United States Patent　(10) Patent No.: US 12,381,174 B2
Patil et al.　(45) Date of Patent: Aug. 5, 2025

(54) INTEGRATED CIRCUIT (IC) PACKAGES EMPLOYING WIRE BOND CHANNEL OVER PACKAGE SUBSTRATE, AND RELATED FABRICATION METHODS

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 517 days.

(21) Appl. No.: 17/809,675

(22) Filed: Jun. 29, 2022

(65) Prior Publication Data

US 2024/0006369 A1　Jan. 4, 2024

(51) Int. Cl.
　　*H01L 23/00*　　(2006.01)
　　*H01L 21/48*　　(2006.01)
　　*H01L 23/498*　(2006.01)

(52) U.S. Cl.
　　CPC .......... *H01L 24/48* (2013.01); *H01L 21/4853* (2013.01); *H01L 21/4857* (2013.01);
　　(Continued)

(58) Field of Classification Search
　　CPC ... H01L 24/48; H01L 24/85; H01L 23/49822; H01L 23/64; H01L 23/66; H01L 25/0655; H01L 25/50
　　(Continued)

(56) References Cited

U.S. PATENT DOCUMENTS

| | | | |
|---|---|---|---|
| 2008/0128919 A1* | 6/2008 | Fishley | H01L 23/50 257/E23.024 |
| 2008/0151484 A1* | 6/2008 | Suzuki | H01L 25/18 361/820 |

(Continued)

FOREIGN PATENT DOCUMENTS

WO　2016025693 A1　2/2016

OTHER PUBLICATIONS

International Search Report and Written Opinion for International Patent Application No. PCT/US2023/068936, mailed Sep. 13, 2023, 12 pages.

*Primary Examiner* — Jasmine J Clark
(74) *Attorney, Agent, or Firm* — Withrow & Terranova, PLLC

(57) ABSTRACT

Integrated circuit (IC) packages employing wire bond channel over package substrate, and related fabrication methods. The IC package includes a first semiconductor die ("first die") and a first electronic device each coupled to a package substrate. To provide signal routing paths between the first die and the first electronic device, the IC package includes a wire bond channel that includes wire bonds coupled between first and second metal pads coupled to the respective first die and first electronic device to provide signal routing paths between the first die and first electronic device. The wire bonds extend outside of the package substrate in a vertical direction. The wire bond channel may be able to support more direct signal routing paths between the first die and the first electronic device without having to route such signal routing paths around a KoZ in the package substrate.

23 Claims, 11 Drawing Sheets

(52) U.S. Cl.
CPC .. *H01L 23/49822* (2013.01); *H01L 23/49838* (2013.01); *H01L 24/85* (2013.01); *H01L 2224/48111* (2013.01); *H01L 2924/19107* (2013.01)

(58) Field of Classification Search
USPC ........................................................ 257/784
See application file for complete search history.

(56) References Cited

U.S. PATENT DOCUMENTS

2019/0279948 A1  9/2019  Moreau et al.
2021/0120706 A1  4/2021  Sato

* cited by examiner

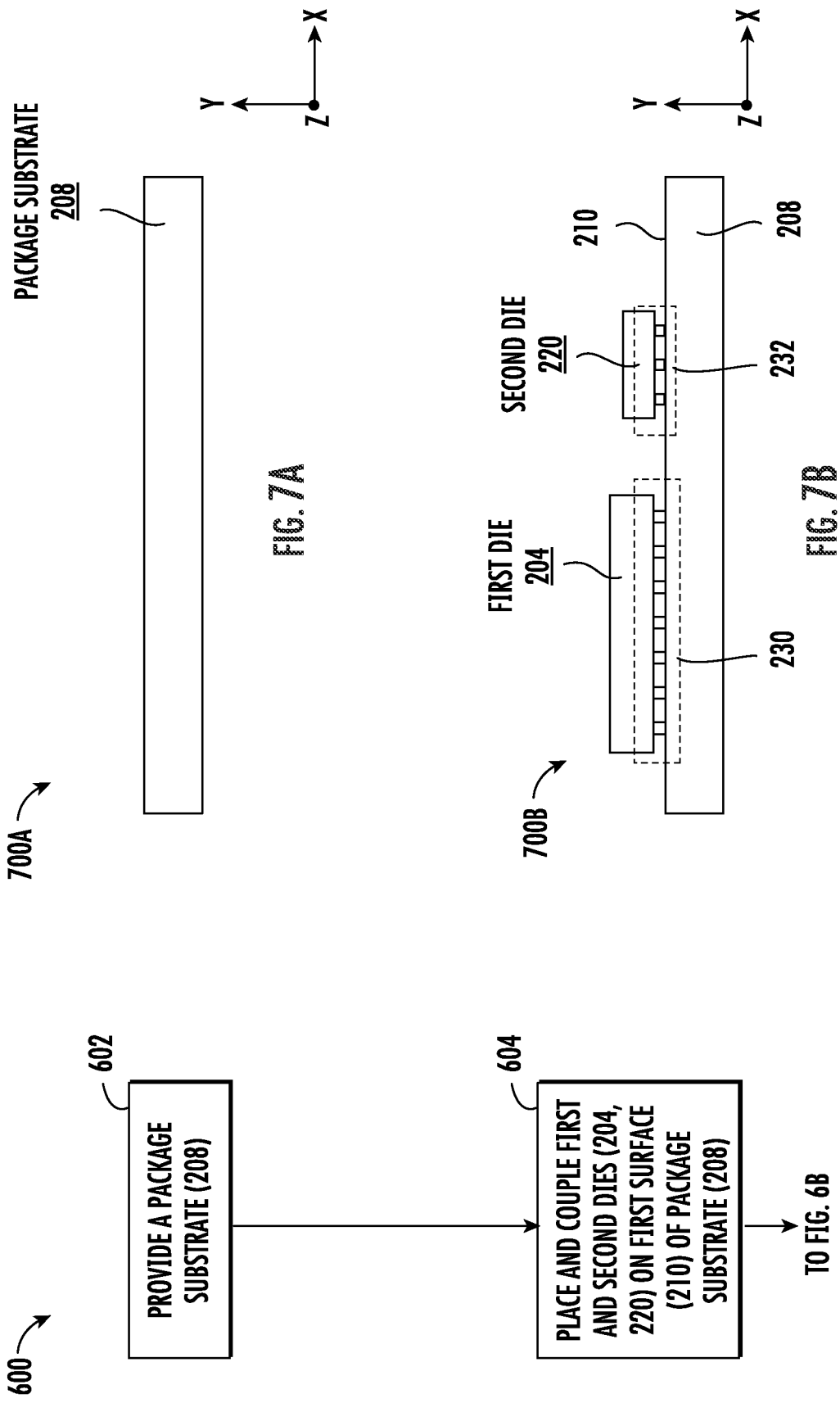

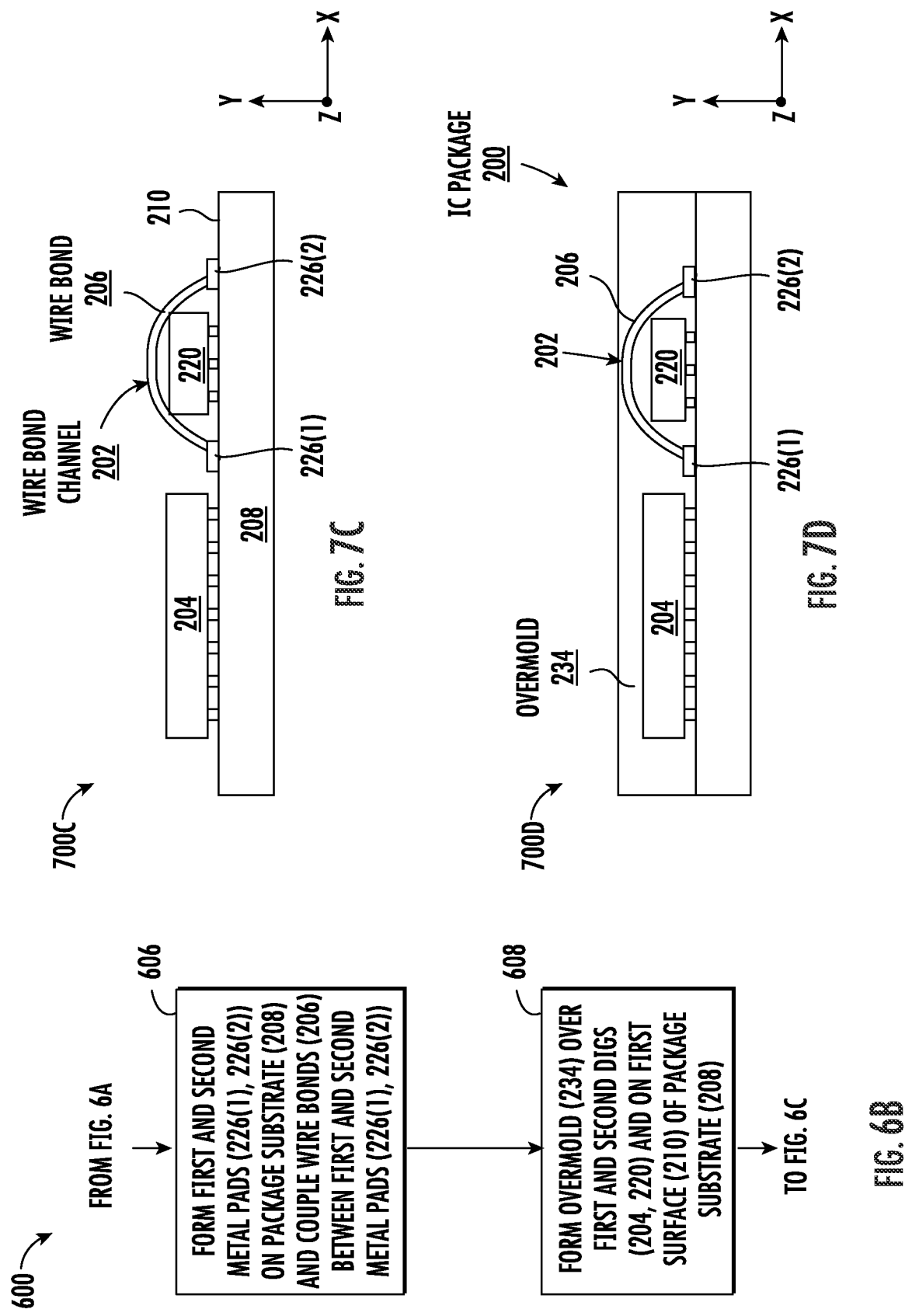

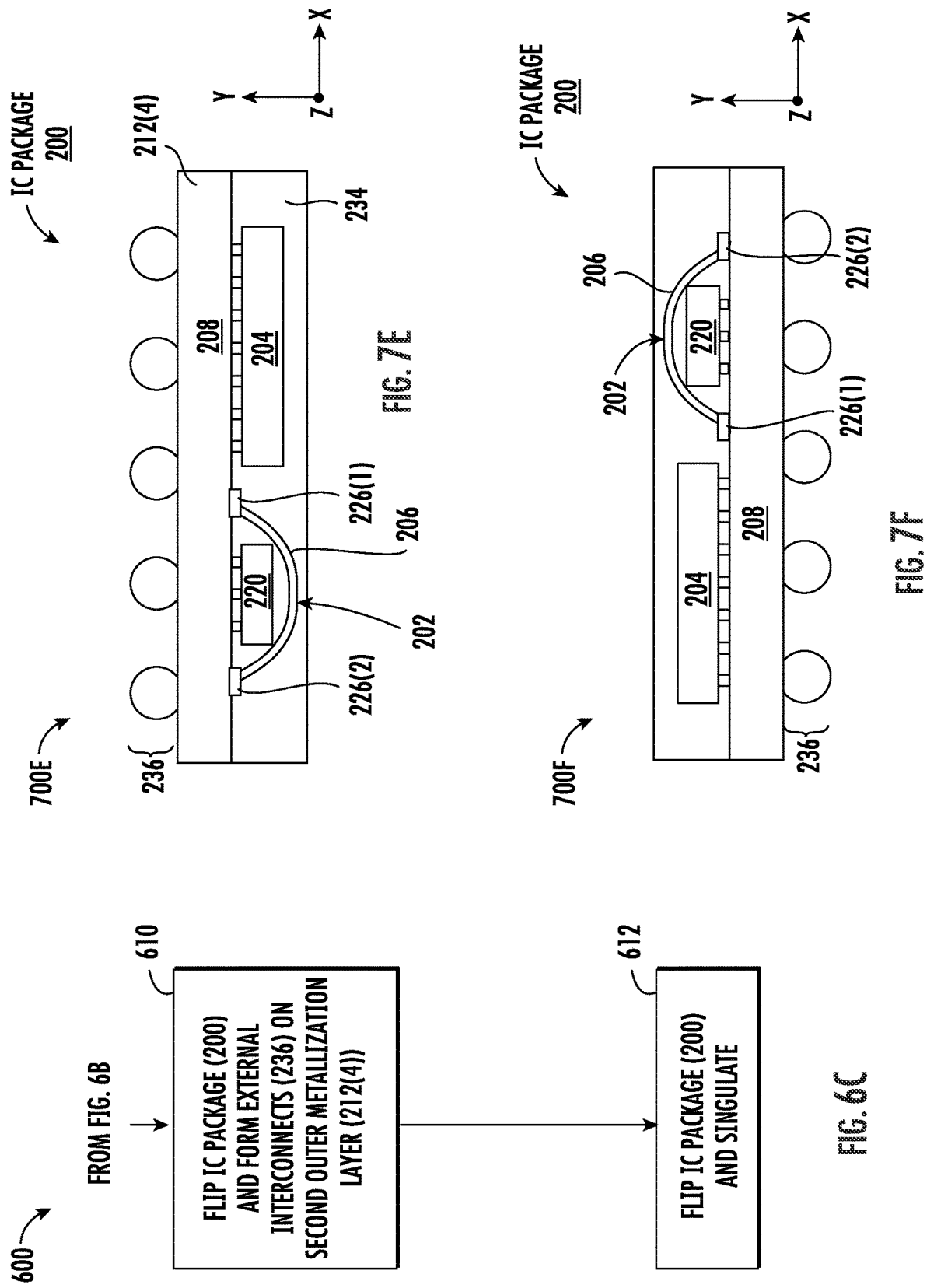

INTEGRATED CIRCUIT (IC) PACKAGES EMPLOYING WIRE BOND CHANNEL OVER PACKAGE SUBSTRATE, AND RELATED FABRICATION METHODS

BACKGROUND

I. Field of the Disclosure

The field of the disclosure relates to integrated circuit (IC) packages that include one or more semiconductor dies supported by a package substrate, and more particularly to communicatively coupling of a semiconductor die in the IC package to another electronic device (e.g., another die) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") that are mounted on and electrically coupled to a package substrate to provide physical support and an electrical interface to the die(s). The die(s) is electrically interfaced to metal interconnects (e.g., metal traces, metal lines) in a top metallization layer of the package substrate. The package substrate can also include one or more other metallization layers that include metal interconnects (e.g., metal traces, metal lines) with vertical interconnect accesses (vias) coupling the metal interconnects together between adjacent metallization layers to provide electrical interfaces through the package substrate to the die(s). The package substrate also includes a bottom, outer metallization layer that includes metal interconnects coupled to external metal interconnects (e.g., ball grid array (BOA) interconnects) to provide an external interface between the die(s) in the IC package. The external metal interconnects can also be coupled (e.g., soldered) to traces in a printed circuit board (PCB) to attach the IC package to the PCB to interface its die(s) with the other circuitry coupled to the PCB.

Multiple ICs can be mounted to a package substrate in an IC package. For example, an IC package may include a system-on-a-chip (SoC) die and second die coupled to the package substrate. The second die can include, for example, a security circuit, memory, or other circuit, that is desired to provide in a separate die from the SoC in the IC package. To provide a communication interface to the second die, the second die is coupled to metal lines (e.g., metal traces) in one or more metallization layers of the package substrate. These metal lines provide signal routing through the package substrate to and from the second die. For example, some of these metal trac lines may be routed and coupled to the SoC die to support die-to-die (D2D) communications between the SoC die and the second die. The second die may be placed on or adjacent to an outer metallization layer of the package substrate to allow closer connectivity to the SoC die. The second die may also be coupled to metal lines in lower metallization layers of the package substrate below the outer metallization layer. Placement of the second die on the package substrate provides a keep out zone (KoZ) region in the package substrate in which the other metal lines for routing other signals to other electronic devices in the IC package may have to avoid and be routed around in a first, horizontal direction (X-axis and Y-axis directions). For example, metal lines in metallization layers of the package substrate that route signals between the SoC die and other electronic devices in the IC package may have to be routed around the KoZ region of the second die in the package substrate. This causes these signals carried over these other metal lines that are routed around the KoZ region to be longer in length, thereby increasing signal path impedance resulting in additional signal delay in such signals. Also, routing of metal lines around the KoZ region may require the metal lines to have more bends thereby contributing to an increased parasitic capacitance. Routing of metal lines around the KoZ region may also lead to less efficient signal routing and use of routing space in the package substrate, which could lead to an increase in area (in the first, horizontal direction in the X-axis and Y-axis directions) and/or number of metallization layers (in the vertical height, Z-axis direction) needed in the package substrate to provide sufficient signal routing, and at an increased cost.

SUMMARY OF THE DISCLOSURE

Aspects disclosed herein include integrated circuit (IC) packages employing wire bond channel over package substrate. Related fabrication methods are also disclosed. The IC package includes a first semiconductor die ("first die") (e.g., a system-on-a-chip (SoC) die) coupled to a package substrate extending in a first, horizontal direction. The first die is coupled to metal interconnects in a metallization layer(s) of the package substrate for routing of signals over metal lines in the metallization layer(s) to and from the first die. The IC package also includes a first electronic device coupled to the package substrate. The first electronic device may be placed on the package substrate such that a keep out zone (KoZ) in the package substrate would be wholly or partially in a direct signal routing path between the first electronic device and the first die in the package substrate. For example, the KoZ may be a result of another electronic device placed on the package substrate between the first die and first electronic device. In another example, the KoZ may be a result of other signal routing paths in the package substrate. In exemplary aspects, to provide signal routing paths between the first die and the first electronic device in the IC package, the IC package includes a wire bond channel coupled to the first die and the first electronic device. The wire bond channel includes first metal pads coupled to the package substrate and the first die. The wire bond channel also includes second metal pads coupled to the package substrate and the first electronic device. The wire bond channel includes wire bonds that are each coupled to respective first and second metal pads to provide signal routing paths between the first and second metal pads, to provide signal routing pads between the first die and first electronic device. The wire bonds extend from the first metal pads to the second metal pads outside of the package substrate in a second, vertical direction orthogonal to the first direction. In this manner, the wire bond channel may be able to support more direct signal routing paths between the first die and the first electronic device without having to route such signal routing paths around a KoZ in the package substrate.

In one example, the IC package also includes a second electronic device (e.g., a second die or deep trench capacitor (DTC)) coupled to the package substrate and adjacent to the first die. The second electronic device is also coupled to metal interconnects in a metallization layer(s) of the package substrate to provide signal routing paths over metal lines in the metallization layer(s) to and from the second electronic device. The second electronic device is placed on the package substrate such that a signal routing KoZ for the second electronic device is present in the package substrate and wholly or partially in a direct signal routing path between the first die and the first electronic device in the package substrate. In this regard, the first metal pads of the wire bond channel are disposed adjacent to a first side of the second electronic device, between the first die and the second electronic device in the first, horizontal direction of the package substrate. The second metal pads are disposed adjacent to a second side of the second electronic device and are coupled to the package substrate and the first electronic device. The wire bonds of the wire bond channel extend from the first metal pads to the second metal pads outside of the package substrate and over the second electronic device in the second, vertical direction. In this manner, the wire bond channel supports a more direct routing of signals between the first die and the first electronic device without having to provide less direct signal routing paths around the signal routing KoZ in the package substrate.

In another example, the package substrate of the IC package includes other signal routing paths in a metallization layer of package substrate that provides a signal routing KoZ in the package substrate between the first metal pads and the second metal pads of the wire bond channel in the first, horizontal direction (X-axis and Y-axis directions). The wire bonds of the wire bond channel extend from the first metal pads to the second metal pads outside of the package substrate and over the signal routing KoZ in the second, vertical direction. In this manner, the wire bond channel may be able to support a more direct routing of signals between the first die and the first electronic device without having to provide less direct signal routing paths in the package substrate due to having to be routed around the signal routing KoZ in the package substrate.

In this regard, in one exemplary aspect, an IC package is provided. The IC package comprises a package substrate comprising a first surface extending in a first direction. The IC package also comprises a first die coupled to the first surface of the package substrate. The IC package also comprises a wire bond channel. The wire bond channel comprises one or more first metal pads coupled to the first surface of the package substrate and coupled to the first die. The wire bond channel also comprises one or more second metal pads coupled to the first surface of the package substrate. The wire bond channel also comprises one or more wire bonds disposed outside the package substrate, the one or more wire bonds each coupling a respective first metal pad of the one or more first metal pads to a respective second metal pad of the one or more second metal pads.

In another exemplary aspect, a method of fabricating an integrated circuit (IC) package is provided. The method comprises providing a package substrate comprising a first surface extending in a first direction. The method also comprises coupling a first die to the first surface of the package substrate. The method also comprises forming a wire bond channel, comprising: forming one or more first metal pads coupled the first surface of the package substrate and coupled to the first die; forming one or more second metal pads coupled to the first surface of the package substrate; coupling a first end of each of one or more wire bonds outside the package substrate to the one or more first metal pads outside the package substrate; and coupling a second end of each of the one or more wire bonds outside the package substrate to the one or more second metal pads.

BRIEF DESCRIPTION OF THE FIGURES

FIG. 6A-6C is a flowchart illustrating another exemplary fabrication process of fabricating an IC package that includes a first die coupled to a first, outer surface of a package substrate, and further includes a wire bond channel that includes wire bonds extending from first metal pads coupled to the first die, to the second metal pads outside of the package substrate and over a signal routing KoZ in the package substrate in a second, vertical direction, to support more direct signal routing paths between the first die and the second metal pads, including but not limited to the IC packages in FIGS. 2A-2C and 4A-4B;

FIGS. 7A-7F are exemplary fabrication stages during fabrication of an IC package according to the exemplary fabrication process in FIGS. 6A-6C;

DETAILED DESCRIPTION

Figure 1:
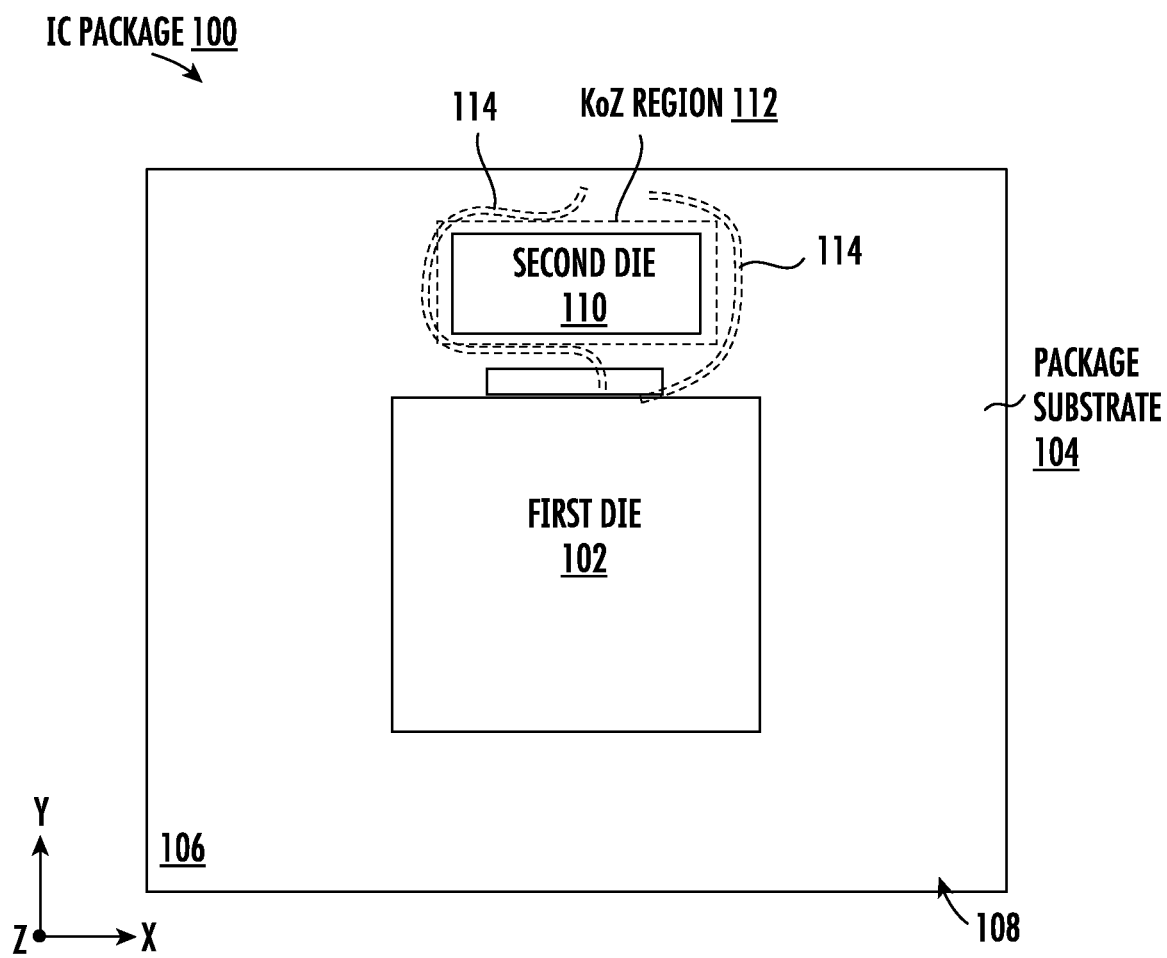
FIG. 1 is a top view of an exemplary integrated circuit (IC) package that includes a first semiconductor die ("die") and first electronic device adjacent to each other and coupled to a first, outer surface of a package substrate, wherein a metallization layer(s) in the package substrate includes signal routing paths that are routed in a first, horizontal direction around a signal routing keep out zone (KoZ) in the package substrate for the first electronic device.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing wire bond channel over package substrate. Related fabrication methods are also disclosed. The IC package includes a first semiconductor die ("first die") (e.g., a system-on-a-chip (SoC) die) coupled to a package substrate extending in a first, horizontal direction. The first die is coupled to metal interconnects in a metallization layer(s) of the package substrate for routing of signals over metal lines in the metallization layer(s) to and from the first die. The IC package also includes a first electronic device coupled to the package substrate. The first electronic device may be placed on the package substrate such that a keep out zone (KoZ) in the package substrate would be wholly or partially in a direct signal routing path between the first electronic device and the first die in the package substrate. For example, the KoZ may be a result of another electronic device placed on the package substrate between the first die and first electronic device. In another example, the KoZ may be a result of other signal routing paths in the package substrate. In exemplary aspects, to provide signal routing paths between the first die and the first electronic device in the IC package, the IC package includes a wire bond channel coupled to the first die and the first electronic device. The wire bond channel includes first metal pads coupled to the package substrate and the first die. The wire bond channel also includes second metal pads coupled to the package substrate and the first electronic device. The wire bond channel includes wire bonds that are each coupled to respective first and second metal pads to provide signal routing paths between the first and second metal pads, to provide signal routing pads between the first die and first electronic device. The wire bonds extend from the first metal pads to the second metal pads outside of the package substrate in a second, vertical direction orthogonal to the first direction. In this manner, the wire bond channel may be able to support more direct signal routing paths between the first die and the first electronic device without having to route such signal routing paths around a KoZ in the package substrate.

Before discussing examples of IC packages that include a wire bond channel coupled to a first die, wherein the wire bond channel includes wire bonds that extend over the package substrate to support more direct signal routing paths to the first die starting at FIG. 2A, an example of an IC package that includes a wire bond channel outside of the package substrate is first described with regard to FIG. 1 below.

FIG. 1 is a top view of an exemplary integrated circuit (IC) package 100 that includes a first semiconductor die ("die") 102 coupled to a package substrate 104. The first die 102 is coupled to a first, outer surface 106 of the package substrate 104. For example, the first die 102 may be a system-on-a-chip (SoC) die. The first die 102 is coupled to an outer metallization layer 108 of the package substrate 104. The outer metallization layer 108 and other metallization layers in the package substrate 104 located beneath the outer metallization layer 108 in a first, vertical direction (Z-axis direction) includes metal lines interconnected by metal interconnects to provide signal routing paths in the package substrate 104. The package substrate 104 includes metal lines that provide signal routing paths for communications to the first die 102. The IC package 100 also includes a second die 110 that is also coupled to the package substrate 104. For example, the second die 110 may include a security circuit, memory, or other circuit, that is desired to provide in a separate die from the first die 102 in the IC package 100. The second die 110 is also coupled to the outer metallization layer 108 of the package substrate 104. The package substrate 104 also includes metal lines that provide signal routing paths for communications to the second die 110. For example, some of the metal lines in the package substrate 104 may be coupled to both the first die 102 and the second die 110 to support die-to-die (D2D) communications between the first die 102 and the second die 110.

With continuing reference to FIG. 1, the second die 110 is placed on package substrate 104 adjacent to the first die 102. Placement of the second die 110 on the package substrate 104 may provide a keep out zone (KoZ) region 112 beneath the second die 110 in the first, vertical direction (Z-axis direction) in the outer metallization layer 108 and/or other metallization layers of the package substrate 104. Other metal lines for routing other signals from the first die 102 to other electronic devices in the IC package 100 may have to avoid and be routed around the KoZ region 112 in a first, horizontal direction (X-axis and Y-axis directions). This is shown in FIG. 1, wherein metal lines 114 (shown as hidden lines) in a metallization layer, such as outer metallization layer 108, in the package substrate 104 and coupled to the first die 102 are routed around the KoZ region 112 in the package substrate 104. This causes these metal lines 114 to be longer in length than they may otherwise be if the metal lines 114 could be routed in the package substrate beneath the second die 110 (i.e., within the package substrate 104 in the vertical space (Z-axis) of the footprint of second die 110), thereby increasing impedance of the metal lines 114. This causes signals carried over the metal lines 114 to experience additional delay. Also, by the metal lines 114 being bent around the KoZ region 112, the metal lines 114 may have increased parasitic capacitance, which also results in signal delay. Further, the routing of the metal lines 114 around the KoZ region 112 may also lead to less efficient signal routing and use of routing space in the package substrate 104. This could lead to an increase in area (in the first, horizontal direction in the X-axis and Y-axis directions) and/or number of metallization layers (in the vertical height, Z-axis direction) needed in the package substrate 104 to provide sufficient signal routing, and at an increased cost.

Figure 2A:
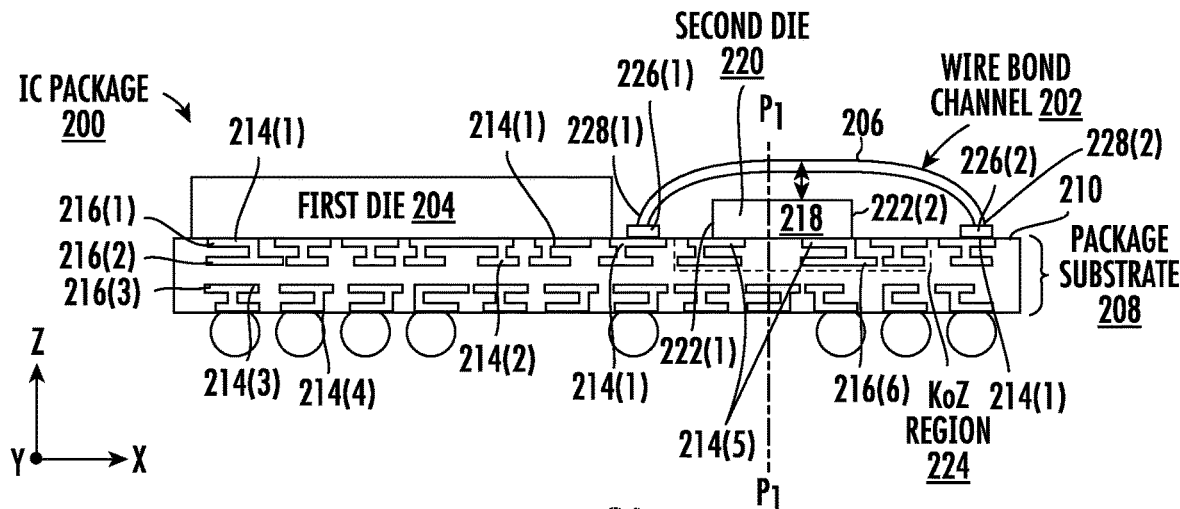
FIG. 2A is a side view of an exemplary IC package that includes a first die and a first electronic device adjacent to each other and coupled to a first, outer surface of a package substrate, and further includes a wire bond channel that includes wire bonds extending at least partially over the first electronic device in a second, vertical direction, to support more direct signal routing paths between the first die and the first electronic device without having to route such signal routing paths around a signal routing KoZ in the package substrate for the first electronic device.
Figure 2B:
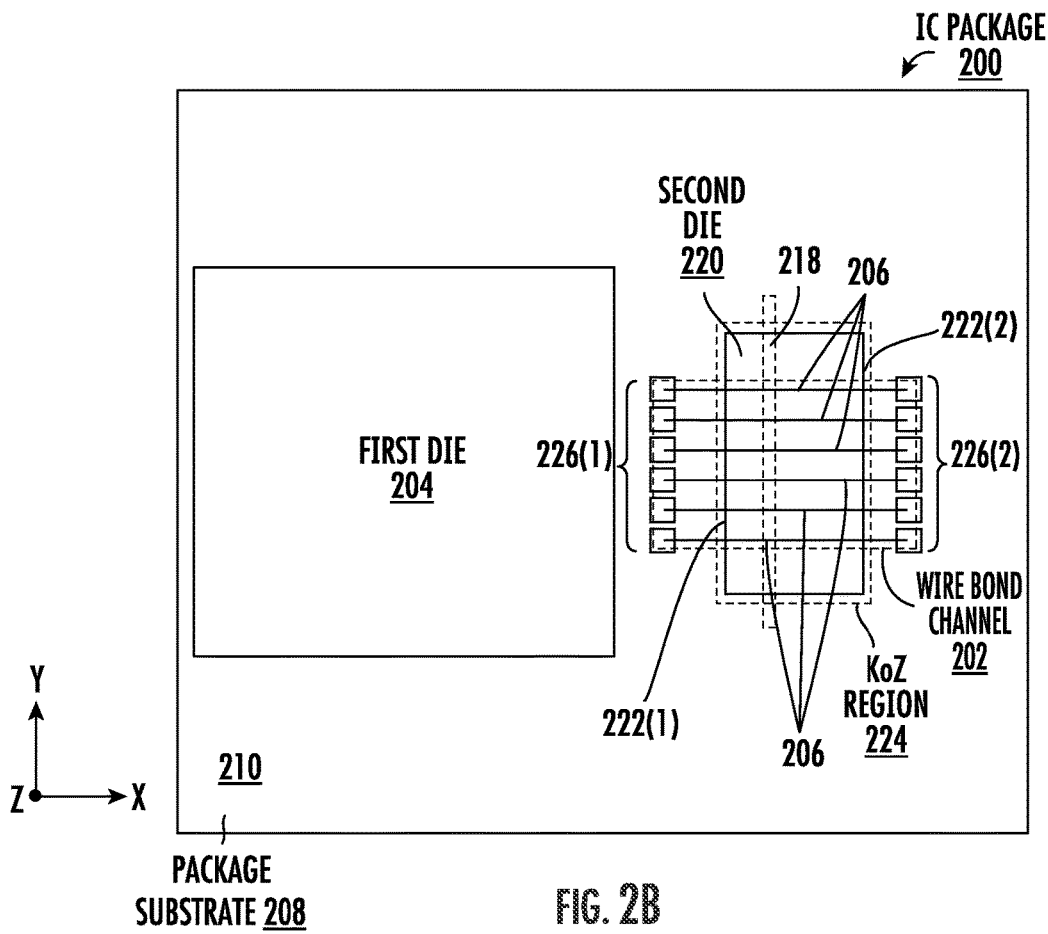
FIG. 2B is a top view of the IC package in FIG. 2A.

FIGS. 2A and 2B are respective side and top views of an exemplary IC package 200 that includes a wire bond channel 202 coupled to a first die 204 to provide a communication channel to the first die 204. The wire bond channel 202 includes wire bonds 206 that extend over a package substrate 208 to support more direct signal routing paths to the first die 204. For example, the wire bond channel 202 can be coupled to another component coupled to the package substrate 208 to provide communications links between the first die 204 and such other component. In this example, the first die 204 is coupled to a first surface 210 of the package substrate 208. The package substrate 208 could be a cored or coreless package substrate as examples. The package substrate 208 may be formed by laminated metallization layers or formed by a build up process of metallization layers being formed on top of each other. The first surface 210 is a planar or substantially planar surface that extends in horizontal directions in the X-axis and Y-axis directions in this example. For example, the first surface 210, may be an outer surface of an outer metallization layer 212(1) of the package substrate 208. As shown in FIG. 2A, the first die 204 can be coupled to metal interconnects 214(1) in the outer metallization layer 212(1) to couple the first die 204 to the package substrate 208 to provide signal routing paths between the package substrate 208 and the first die 204. The outer metallization layer 212(1) could be formed as an embedded trace substrate (ETS) layer as an example. The metal interconnects 214(1) form or are coupled to metal lines 216(1) in the outer metallization layer 212(1) that provide signal routing paths in the package substrate 208. The metal lines 216(1) could be formed as redistributed lines (RDLs) as an example. The metal lines 216(1) in the outer metallization layer 212(1) can also be coupled to metal lines 216(2)-216(4), via metal interconnects 214(2)-214(4) (e.g., vias, metal posts), in other metallization layers 212(2)-212(4) to provide signal routing paths in the package substrate 208.

With continuing reference to FIGS. 2A and 2B, a second electronic device 218 in the form of a second die 220 is also coupled to the first surface 210 of the package substrate 208. As an alternative, the second electronic device 218 could be a deep trench capacitor (DTC) that includes capacitors formed in trenches embedded in a semiconductor substrate similar to a semiconductor substrate of a die. The second die 220 is disposed adjacent to the first die 204 on the first surface 210 of the package substrate 208. In this example, a first side 222 of the second die 220 is adjacent to the first die 204. The second die 220 is also coupled to metal interconnects 214(1) in the outer metallization layer 212(1) to couple the second die 220 to the package substrate 208 to provide signal routing paths between the package substrate 208 and the second die 220. The metal interconnects 214(1) form or are coupled to metal lines 216(5) in the outer metallization layer 212(1) below the second die 220 in the second, vertical direction (Z-axis direction) that provide signal routing paths for the second die 220 in the package substrate 208. The metal lines 216(5) in the outer metallization layer 212(1) can also be coupled to other metal lines 216(2)-216(4), via metal interconnects 214(2) (e.g., vias, metal posts), in other metallization layers 212(2)-212(4) to provide signal routing paths in the package substrate 208. In this example, the second die 220 creates a KoZ region 224 in the package substrate 208, as shown in the side view of the IC package 200 in FIG. 2A, due to the metal lines 216(5), 216(6) provided in the KoZ region 224 that are dedicated to routing of signals to the second die 220. The KoZ region 224 is shown in hidden lines in the top view of the IC package 200 in FIG. 2B. Thus, KoZ region 224 is a region defined by metal lines 216(5), 216(6) in the metallization layers 212(1), 212(2) that are not used to route signals to other components independent of the second die 220 in this example. The KoZ region 224 extends with the package substrate 208 in the first, horizontal directions in the X-axis and Y-axis directions. The KoZ region 224 also extends in the second, vertical direction (Z-axis direction) within the package substrate 208. Thus, the KoZ region 224 has a horizontal area footprint in the first, horizontal directions in the X-axis and Y-axis directions that extends in the vertical direction (Z-axis direction). Other signal routing paths that must traverse in the area of the KoZ region 224 must be routed outside of the KoZ region 224 so as to not interfere with the signal routing paths provided by the metal lines 216(5), 216(6).

Figure 2C:
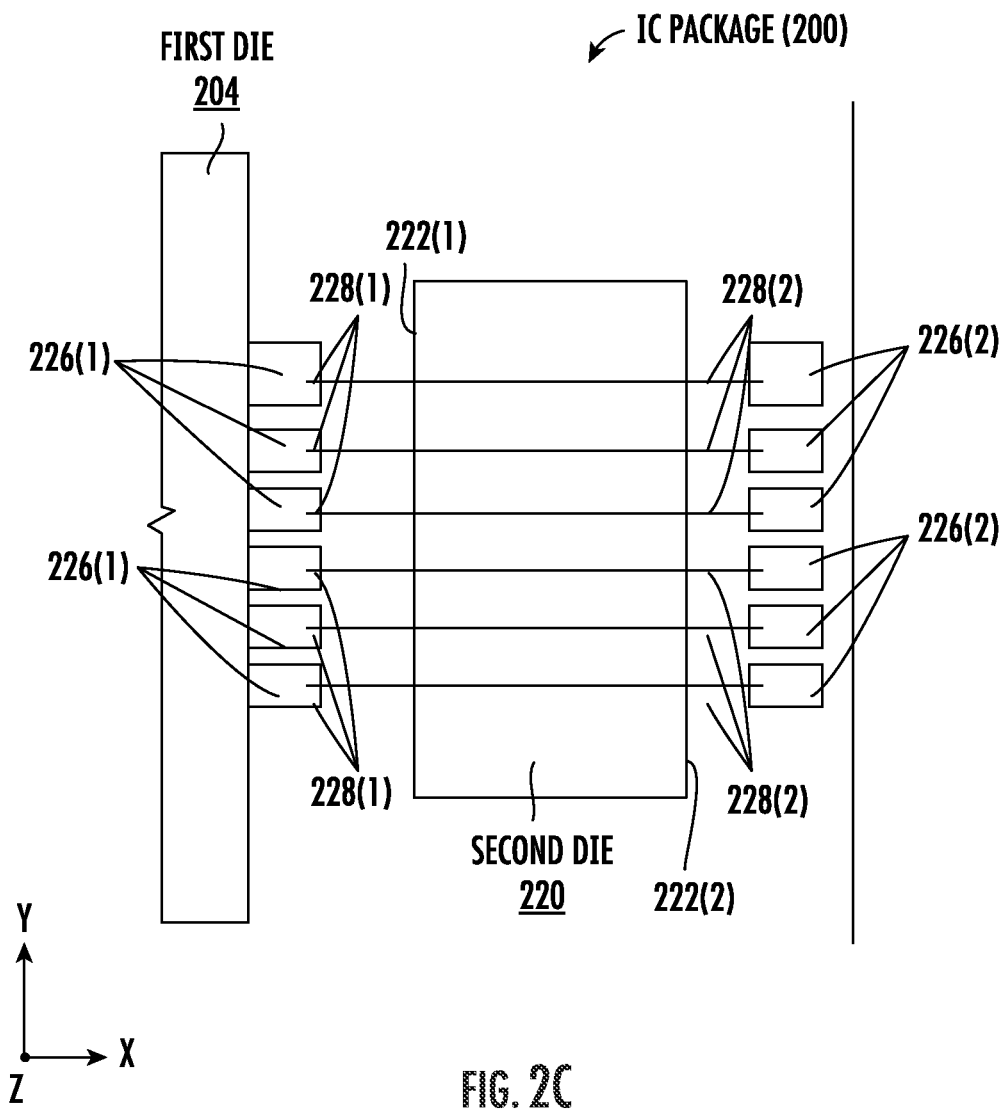
FIG. 2C is a close up top view of the IC package in FIG. 2A.

With continuing reference to FIGS. 2A and 2B, to provide signal routing paths to the first die 204 that are desired to be routed through the KoZ region 224 of the package substrate 208 to avoid having to route such signal routing paths around the KoZ region 224 (like shown in the example in FIG. 1), the wire bond channel 202 is provided. In this example, the wire bond channel 202 is formed by first metal pads 226(1) and second metal pads 226(2) formed on the package substrate 208. For example, the first metal pads 226(1) and second metal pads 226(2) can be formed on the first surface 210 of the package substrate 208. The first and second metal pads 226(1), 226(2) can be bonding pads that are made of a metal, such as a lead material in which wires can be bonded (e.g., soldered). The first metal pads 226(1) and second metal pads 226(2) are coupled to respective metal lines 216(5) in the outer metallization layer 212(1) of the package substrate 208 to provide a signal routing path between the first and second metal pads 226(1), 226(2) and the package substrate 208. In this example, the first metal pads 226(1) are located adjacent to the first die 204, between the first die 204 and the first side 222 of the second die 220. The second metal pads 226(2) are located adjacent to the second die 220, adjacent to a second side 222(2) of the second die 220 on an opposite side of the first side 222(1) of the second die 220. The first metal pads 226(1) are coupled to the first die 204 by being coupled to metal interconnects 214(1) of a first metal line 216(1) exposed from the first surface 210 of the package substrate 208. The second metal pads 226(2) are coupled to metal interconnects 214(1) of a metal line 216(1) exposed from the first surface 210 of the package substrate 208. As shown in FIG. 2B and in more detail in the top view of the IC package 200 in FIG. 2C, wire bonds 206 are provided that are metal wires coupled (e.g., bonded) on their respective first and second ends 228(1), 228(2) to the first and second metal pads 226(1), 226(2) to provide conductive connections between the first and second metal pads 226(1), 226(2). The wire bonds 206 are external to and outside of the package substrate 208. The wire bonds 206 in this example extend over the first surface 210 of the package substrate 208 and over the second die 220 in the second, vertical direction (Z-axis direction), orthogonal to the first, horizontal direction (X-axis and Y-axis directions) of the first surface 210. In this example, each of the wire bonds 206 intersect a vertical plane $P_1$ in the vertical direction (Z-axis direction) that also intersects the second die 220. The vertical plane $P_1$ is orthogonal to the first, horizontal direction (X-axis and Y-axis directions) of the package substrate 208. However, each wire bond 206 is not required to intersect the vertical plane $P_1$ that also intersects the second die 220.

In this manner, the wire bonds 206 provide signal routing paths to the first die 204 that can extend over the second die 220, outside the package substrate 208, to the second metal pads 226(2) to provide a more direct signal routing path between the first die 204 and the second metal pads 226(2). The signal routing paths do not have to be routed around the KoZ region 224 in the package substrate 208 due to the presence of the second die 220 and its connectivity to metal lines 216(5), 216(6) in the package substrate 208. In this example, the wire bonds 206 are routed between the first and second metal pads 226(1), 226(2) in a direction that is different than the direction of the signal routing over the metal lines 216(1) between the first die 204 and the first metal pads 226(1).

Figure 3:
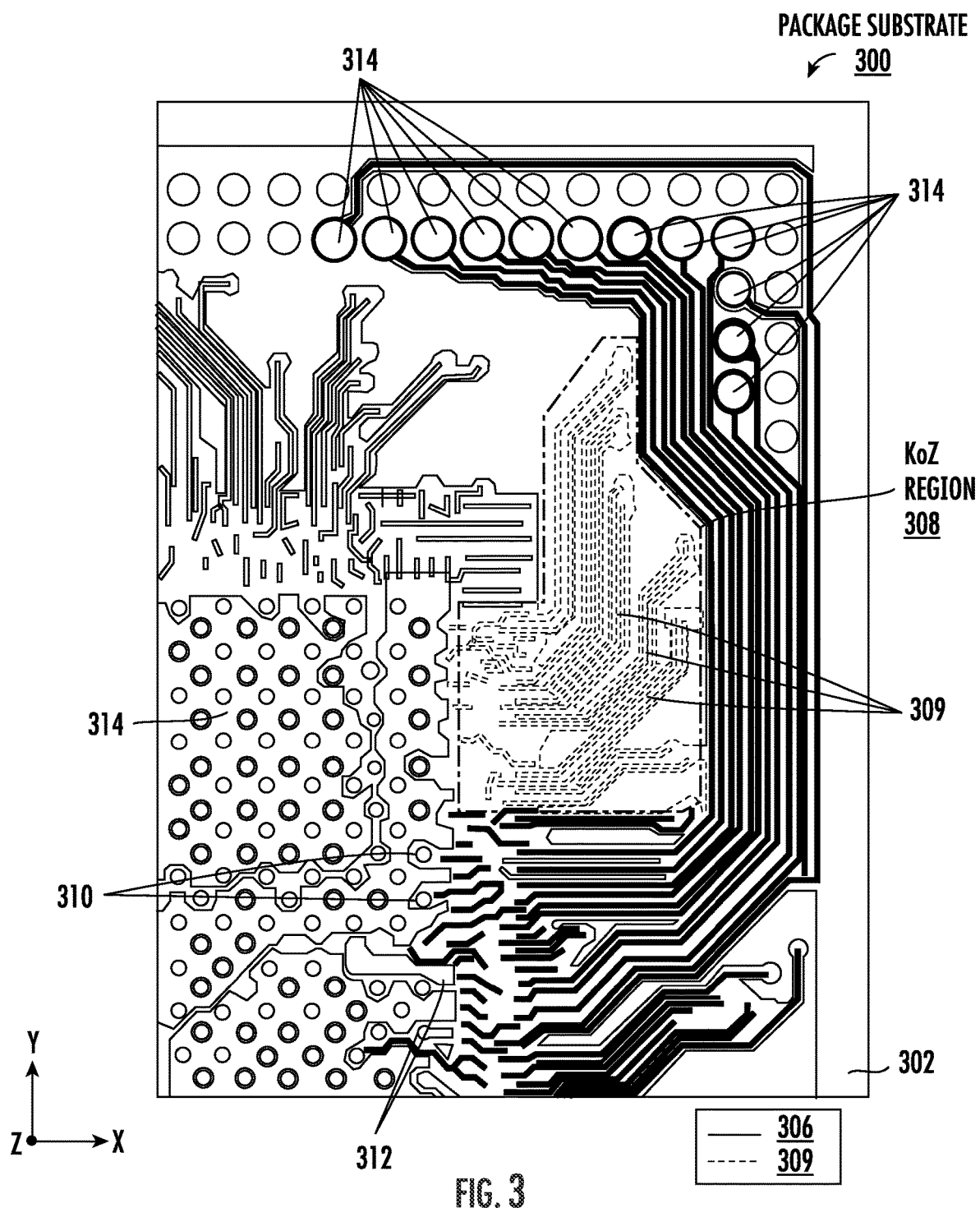
FIG. 3 is a top view of another package substrate that includes signal routing paths in a metallization layer routed around a signal routing KoZ in the metallization layer.

KoZ regions can be present in a package substrate even if not directly beneath another component, such as a die, coupled to the package substrate. A wire bond channel can also be provided in such package substrates to avoid having to route signal routing paths around the KoZ region. In this regard, FIG. 3 is a top view of another package substrate 300 that can be provided in an IC package that includes metal lines 306 in an outer metallization layer 302 routed around a signal routing KoZ region 308 in the outer metallization layer 302. Other metal lines 309 are disposed in the outer metallization layer 302 that form the KoZ region 308. The metal lines 309 in the KoZ region 308 are not present in the outer metallization layer 302 due to the package substrate 300 being designed for another die or other electronic component to be mounted on the package substrate 300 above the metal lines 306 (out of page in FIG. 3) in the vertical direction (Z-axis direction). As shown in FIG. 3, package substrate 300 includes other metal lines 310 that are coupled to metal interconnects 312 as part of a landing area 314 for a die to be coupled to the outer metallization layer 302. These other metal lines 310 are routed around the KoZ region 308 to other metal interconnects 312 in the outer metallization layer 302.

Figure 4A:
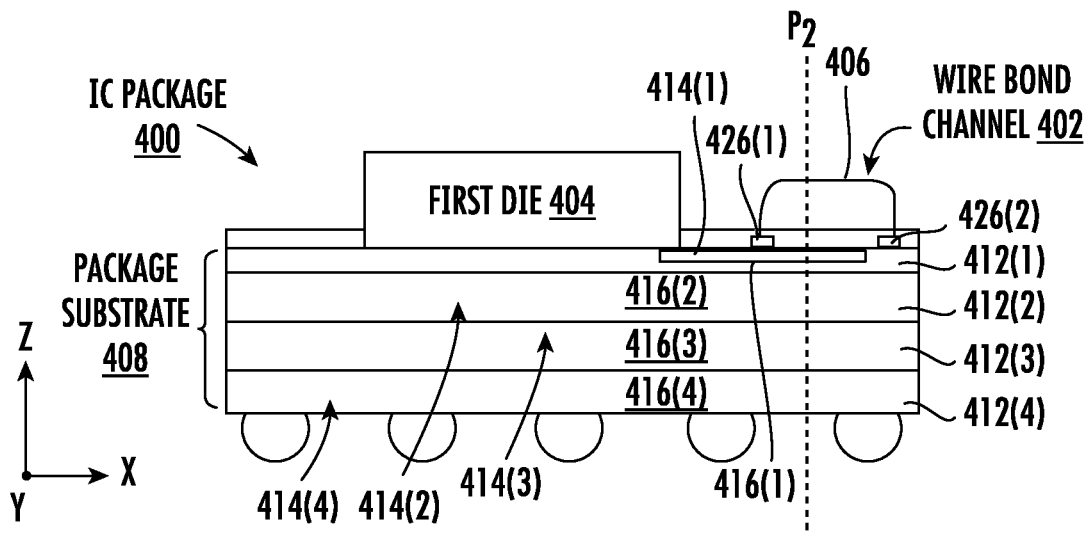
FIG. 4A is a side view of another exemplary IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a second, vertical direction, to support more direct signal routing paths between the first die and the second metal pads.
Figure 4B:
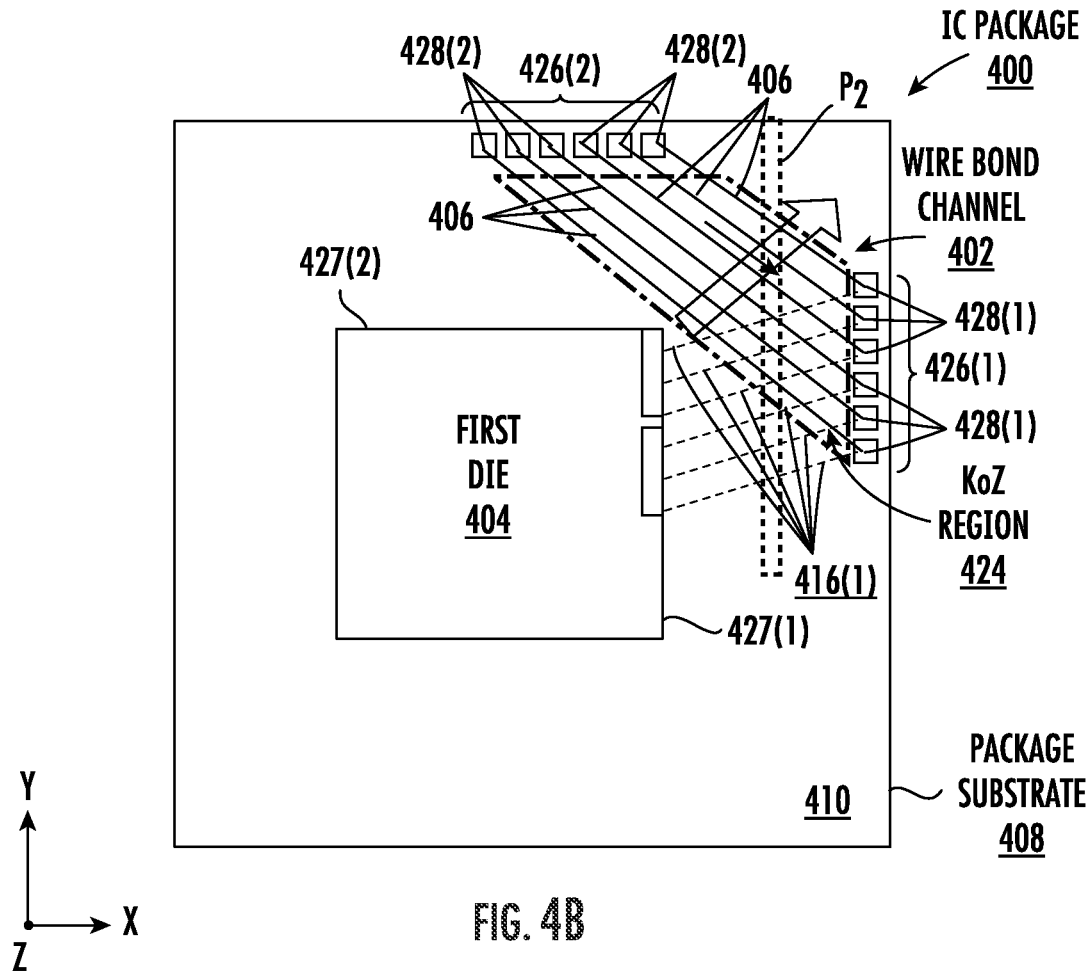
FIG. 4B is a top view of the IC package in FIG. 4A.

FIGS. 4A and 4B are respective side and top views of an exemplary IC package 400 that includes a wire bond channel 402 for providing a communication channel to a first die 404 without having to route such communication channel around a KoZ region in a package substrate 408 of the IC package 400. For example, it may be desired to provide signal routing paths between the first die 404 and another component in the IC package 400 where a KoZ region 424 is present in the desired signal routing path, but such KoZ region is not due to metal lines present in the package substrate 408 due to placement of a second electronic component on the package substrate 408 above the KoZ region 424. The signal routing path between the first die 404 and such other component may include both signal routing paths that extend through the package substrate 408 as well as through the wire bond channel 402 that extends outside of the package substrate 408.

In this regard, as shown in FIGS. 4A and 4B, the wire bond channel 402 includes wire bonds 406 that extend over the package substrate 408 to support signal routing paths to the first die 404. For example, the wire bond channel 402 can be coupled to another component coupled to the package substrate 408 to provide communications links between the first die 404 and such other component. In this example, the first die 404 is coupled to a first surface 410 of the package substrate 408. The package substrate 408 could be a cored or coreless package substrate as examples. The package substrate 408 may be formed by laminated metallization layers or formed by a build up process of metallization layers being formed on top of each other. The first surface 410 is a planar or substantially planar surface that extends in horizontal directions in the X-axis and Y-axis directions in this example. For example, the first surface 410 maybe an outer surface of an outer metallization layer 412(1) of the package substrate 408. The outer metallization layer 412(1) could be formed as an ETS layer as an example. As shown in FIG. 4A, the first die 404 can be coupled to metal interconnects 414(1) in the outer metallization layer 412(1) to couple the first die 404 to the package substrate 408 to provide signal routing paths between the package substrate 408 and the first die 404. The metal interconnects 414(1) form or are coupled to first metal lines 416(1) in the outer metallization layer 412(1) that provide signal routing paths in the package substrate 408. The first metal lines 416(1) could be formed as RDLs as an example. The first metal lines 416(1) in the outer metallization layer 412(1) can also be coupled to other metal lines 416(2)-416(4), via metal interconnects 414(2)-414(4) (e.g., vias, metal posts), in other metallization layers 412(2)-412(4) to provide signal routing paths in the package substrate 408.

With reference to FIG. 4B, a KoZ region 424 is present in the package substrate 408 due to the presence of metal lines that are dedicated to routing of signals not routed on the first metal lines 416(1). Thus, KoZ region 224 is a region defined by metal lines in a metallization layer(s) 412(1)-412(4) used to route other signals other than the signal routed over first metal lines 416(1). The KoZ region 424 extends with the package substrate 408 in the first, horizontal directions in the X-axis and Y-axis directions. The KoZ region 424 also extends in the second, vertical direction (Z-axis direction) within the package substrate 408. Thus, the KoZ region 424 has a horizontal area footprint in the first, horizontal directions in the X-axis and Y-axis directions that extends in the vertical direction (Z-axis direction). Other signal routing paths that must traverse in the area of the KoZ region 424 must be routed outside of the KoZ region 424.

With continuing reference to FIGS. 2A and 2B, to provide signal routing paths to the first die 404 that are desired to be routed through the KoZ region 424 of the package substrate 408 to avoid having to route such signal routing paths around the KoZ region 424(like shown in the example in FIG. 3), the wire bond channel 402 is provided. In this example, the wire bond channel 402 is formed by first metal pads 426(1) and second metal pads 426(2) formed on the package substrate 408. For example, the first metal pads 426(1) and second metal pads 426(2) can be formed on the first surface 410 of the package substrate 408. The first and second metal pads 426(1), 426(2) can be bonding pads that are made of a metal, such as a lead material in which wires can be bonded (e.g., soldered). The first metal pads 426(1) are coupled to respective first metal lines 416(1) in the outer metallization layer 412(1) of the package substrate 408 to provide a signal routing path between the first metal pads 426(1) and the first die 404. In this example, the first metal pads 426(1) are located adjacent to a first side 427(1) of the first die 404. The second metal pads 426(2) are located adjacent to a second side 427(2) of the first die 404. The first metal pads 426(1) are coupled to the first die 404 by being coupled to metal interconnects 414(1) coupled to the first metal lines 416(1), wherein the metal interconnects 414(1) are exposed from the first surface 410 of the package substrate 408. As shown in FIG. 4B, the wire bonds 406 are provided that are metal wires coupled (e.g., bonded) on their respective first and second ends 428(1), 428(2) to the first and second metal pads 426(1), 426(2) to provide conductive connections between the first and second metal pads 426(1), 426(2). The wire bonds 406 are external to and outside of the package substrate 408. The wire bonds 406 in this example extend over the first surface 410 of the package substrate 408 in the second, vertical direction (Z-axis direction), orthogonal to the first, horizontal direction (X-axis and Y-axis directions) of the first surface 410. In this example, each of the wire bonds 406 intersect a vertical plane $P_2$ in the vertical direction (Z-axis direction) that also intersects the KoZ region 424. The vertical plane $P_2$ is orthogonal to the first, horizontal direction (X-axis and Y-axis directions) of the package substrate 408. However, each wire bond 406 is not required to intersect the vertical plane $P_2$ that also intersects the KoZ region 424.

In this manner, the wire bonds 406 provide signal routing paths to the first die 404 that can extend over the KoZ region 424, outside the package substrate 408, to the second metal pads 426(2) to provide a signal routing path between the first die 404 and the second metal pads 426(2). The signal routing paths provided by the wire bonds 406 do not have to be routed around the KoZ region 424 in the package substrate 408 due to the presence of the KoZ region 424 in the package substrate 408.

Figure 5:
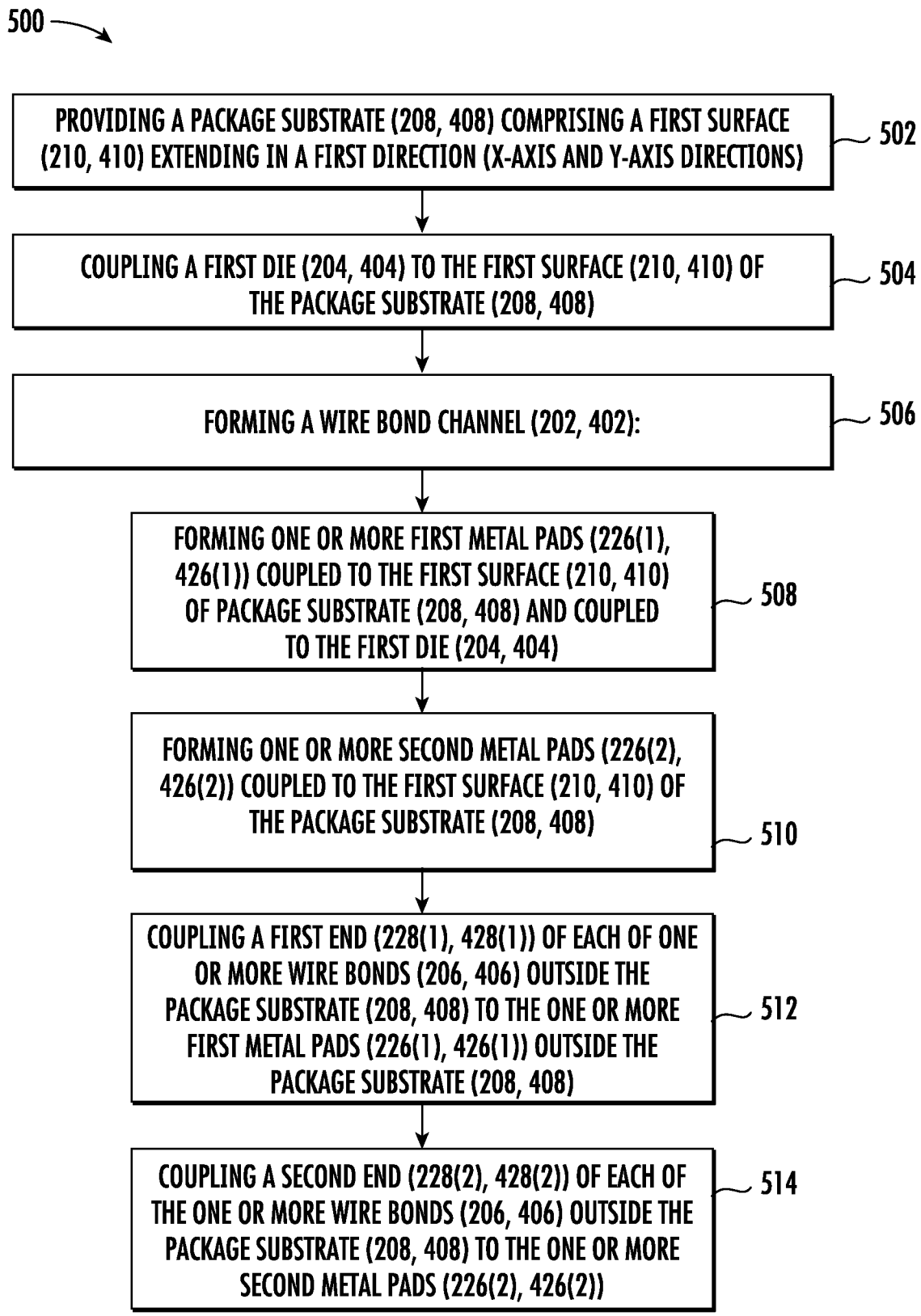
FIG. 5 is a flowchart illustrating an exemplary fabrication process of fabricating an IC package that includes a first die coupled to a first, outer surface of a package substrate, and further includes a wire bond channel that includes wire bonds extending from first metal pads coupled to the first die, to the second metal pads outside of the package substrate and over a signal routing KoZ in the package substrate in a second, vertical direction, to support more direct signal routing paths between the first die and the second metal pads, including but not limited to the IC packages in FIGS. 2A-2C and 4A-4B.

Fabrication processes can be employed to fabricate an IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages 200, 400 in FIGS. 2A-2C and 4A-4B. In this regard, FIG. 5 is a flowchart illustrating an exemplary fabrication process 500 of fabricating an IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2A and 4A-4B. The fabrication process 500 in FIG. 5 is discussed with regard to the IC package 200, 400 in FIGS. 2A-2C and 4A and 4B, but note that the fabrication process 500 is not limited to fabricating an IC package like the IC packages 200, 400 in FIGS. 2A-2C, and 4A and 4B.

In this regard, as shown in FIG. 5, a first step of the fabrication process 500 in this example can be providing a package substrate 208, 408 comprising a first surface 210, 410) extending in a first direction (X-axis and Y-axis directions)(block 502 in FIG. 5). A next step in the fabrication process 500 can be coupling a first die 204, 404 to the first surface 210, 410 of the package substrate 208, 408 (block 504 in FIG. 5). A next step in the fabrication process 500 can be forming a wire bond channel 202, 402 (block 506 in FIG. 5). Forming the wire bond channel 202, 402 can include forming one or more first metal pads 226(1), 426(1) coupled to the first surface 210, 410 of package substrate 208, 408) and coupled to the first die 204, 404 (block 508 in FIG. 5). Forming the wire bond channel 202, 402 can also include forming one or more second metal pads 226(2), 426(2) coupled to the first surface 210, 410 of the package substrate 208, 408 (block 510 in FIG. 5). Forming the wire bond channel 202, 402 can also include coupling a first end 228(1), 428(1) of each of one or more wire bonds 206, 406 outside the package substrate 208, 408 to the one or more first metal pads 226(1), 426(1) outside the package substrate 208, 408 (block 512 in FIG. 5). Forming the wire bond channel 202, 402 can also include coupling a second end 228(2), 428(2) of each of the one or more wire bonds 206, 406 outside the package substrate 208, 408 to the one or more second metal pads 226(2), 426(2) (block 514 in FIG. 5).

Other fabrication processes can also be employed to fabricate an IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2C and 4A-4B. In this regard, FIGS. 6A-6C is a flowchart illustrating another exemplary fabrication process 600 of fabricating an IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2C and 4A-4B. FIGS. 7A-7F are exemplary fabrication stages 700A-700F during fabrication of an IC package according to the fabrication process 600 in FIGS. 6A-6C. The fabrication process 600 in FIGS. 6A-6C, and as shown in the fabrication stages 700A-700F in FIGS. 7A-7F, are discussed in reference to the IC package 200 in FIGS. 2A and 2C, but note that such is not limiting. Note that the fabrication process 600 can be to form a plurality of IC packages 200 in the same process, which are then singulated when fabricated.

In this regard, as shown in the fabrication stage 700A in FIG. 7A, a first step in fabricating the IC package 200 is to provide a package substrate 208 (block 602 in FIG. 6A). As shown in the fabrication stage 700B in FIG. 7B, a next step in fabricating the IC package 200 is to place and couple the first die 204 and the second die 220 on the first surface 210 of the package substrate (block 604 in FIG. 6A). Die interconnects 230 of the first die 204 are coupled to the package substrate 208 to physical and electrically couple the first die 204 to the package substrate 208. Die interconnects 232 of the second die 220 are coupled to the package substrate 208 to physical and electrically couple the second die 220 to the package substrate 208.

As shown in the fabrication stage 700C in FIG. 7C, a next step in fabricating the IC package 200 is to form the first and second metal pads 226(1), 226(2) on the first surface 210 of the package substrate 208 (block 606 in FIG. 6B). The first metal pads 226(1) are coupled to the first die 204 through the package substrate 208. The wire bond 206 is then coupled between the first and second metal pads 226(1), 226(2) to form the wire bond channel 202. The wire bond 206 is formed over the first surface 210 of the package substrate 208 and outside of the package substrate 208, and over the second die 220. Then, as shown in the fabrication stage 700D in FIG. 7D, a next step in fabricating the IC package 200 is to form an overmold 234 from an overmolding material over the first and second dies 204, 220 and on the first surface 210 of the package substrate 208 to insulate and protect the first and second dies 204, 220 and form IC package 200 (block 608 in FIG. 6B).

As shown in the fabrication stage 700E in FIG. 7E, a next step in fabricating the IC package 200 is to flip the IC package 200 and form external interconnects 236 (e.g., solder bumps, ball grid array (BGA) interconnects) on and/or coupled with the second outer metallization layer 212(4) of the package substrate 208 to provide an external interface to the IC package 200 (block 610 in FIG. 6C). Then, as shown in the fabrication stage 700F in FIG. 7F, a next step in fabricating the IC package 200 is to flip the IC package 200 again after the external interconnects 236 are formed on the package substrate 208. The IC package 200, and its external interconnects 236, can be mounted in a printed circuit board (PCB) as an example. If the IC package 200 is formed on a package substrate 208 with a number of other IC packages 200 at the same time, the IC packages 200 can be singulated.

An IC package that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2C, 4A-4B, and 7A-7F, and according to, but not limited to, any of the exemplary fabrication processes in FIGS. 5-6C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 8:
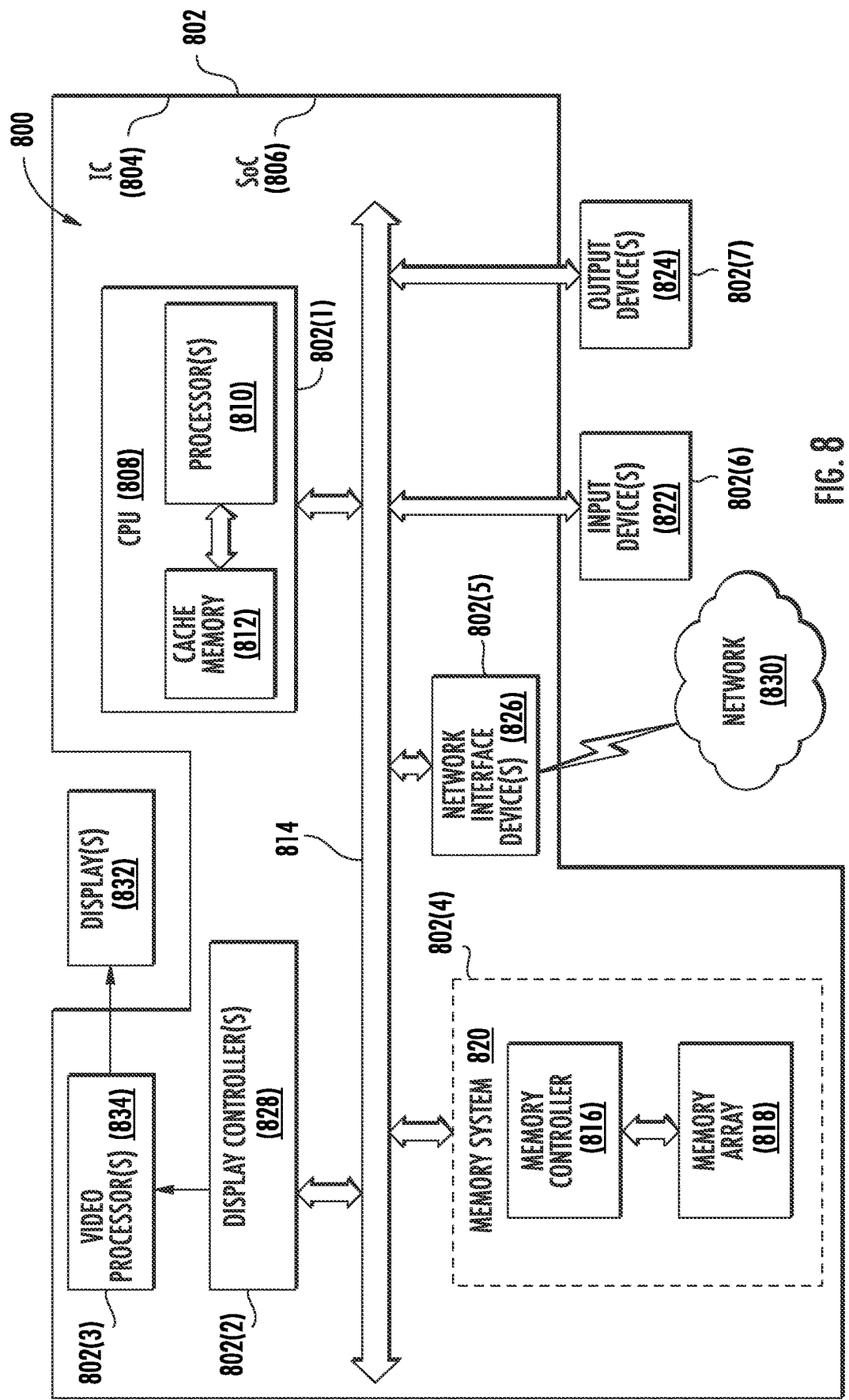
FIG. 8 is a block diagram of an exemplary processor-based system that can include components that can include an IC package that includes a first die coupled to a first, outer surface of a package substrate, and further includes a wire bond channel that includes wire bonds extending from first metal pads coupled to the first die, to the second metal pads outside of the package substrate and over a signal routing KoZ in the package substrate in a second, vertical direction, to support more direct signal routing paths between the first die and the second metal pads, including but not limited to the IC packages in FIGS. 2A-2C, 4A-4B, and 7A-7F, and according to, but not limited to, any of the exemplary fabrication processes in FIGS. 5-6C.

In this regard, FIG. 8 illustrates an example of a processor-based system 800 including a circuit that can be provided in one or more IC packages 802(1)-802(7). The IC packages 802(1)-802(7) can include a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2C, 4A-4B, and 7A-7F, and according to, but not limited to, any of the exemplary fabrication processes in FIGS. 5-6C. In this example, the processor-based system 800 may be formed as an IC 804 in an IC package 802 and as a system-on-a-chip (SoC) 806. The processor-based system 800 includes a central processing unit (CPU) 808 that includes one or more processors 810, which may also be referred to as CPU cores or processor cores. The CPU 808 may have cache memory 812 coupled to the CPU 808 for rapid access to temporarily stored data. The CPU 808 is coupled to a system bus 814 and can intercouple master and slave devices included in the processor-based system 800. As is well known, the CPU 808 communicates with these other devices by exchanging address, control, and data information over the system bus 814. For example, the CPU 808 can communicate bus transaction requests to a memory controller 816, as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system(s) 820, the one or more input devices 822, the one or more output devices 824, the one or more network interface devices 826, and the one or more display controllers 828 can be provided in the same or different IC packages 802(2)-802(7). The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The CPU 808 may also be configured to access the display controller(s) 828 over the system bus 814 to control information sent to one or more displays 832. The display controller(s) 828 sends information to the display(s) 832 to be displayed via one or more video processor(s) 834, which process the information to be displayed into a format suitable for the display(s) 832. The display controller(s) 828 and video processor(s) 834 can be included as ICs in the same or different IC packages 802(2), 802(3), and in the same or different IC package 802 containing the CPU 808, as an example. The display(s) 832 can include any type of display, including, but not limited to, a cathode ray tube (CRT), a liquid crystal display (LCD), a plasma display, a light emitting diode (LED) display, etc.

Figure 9:
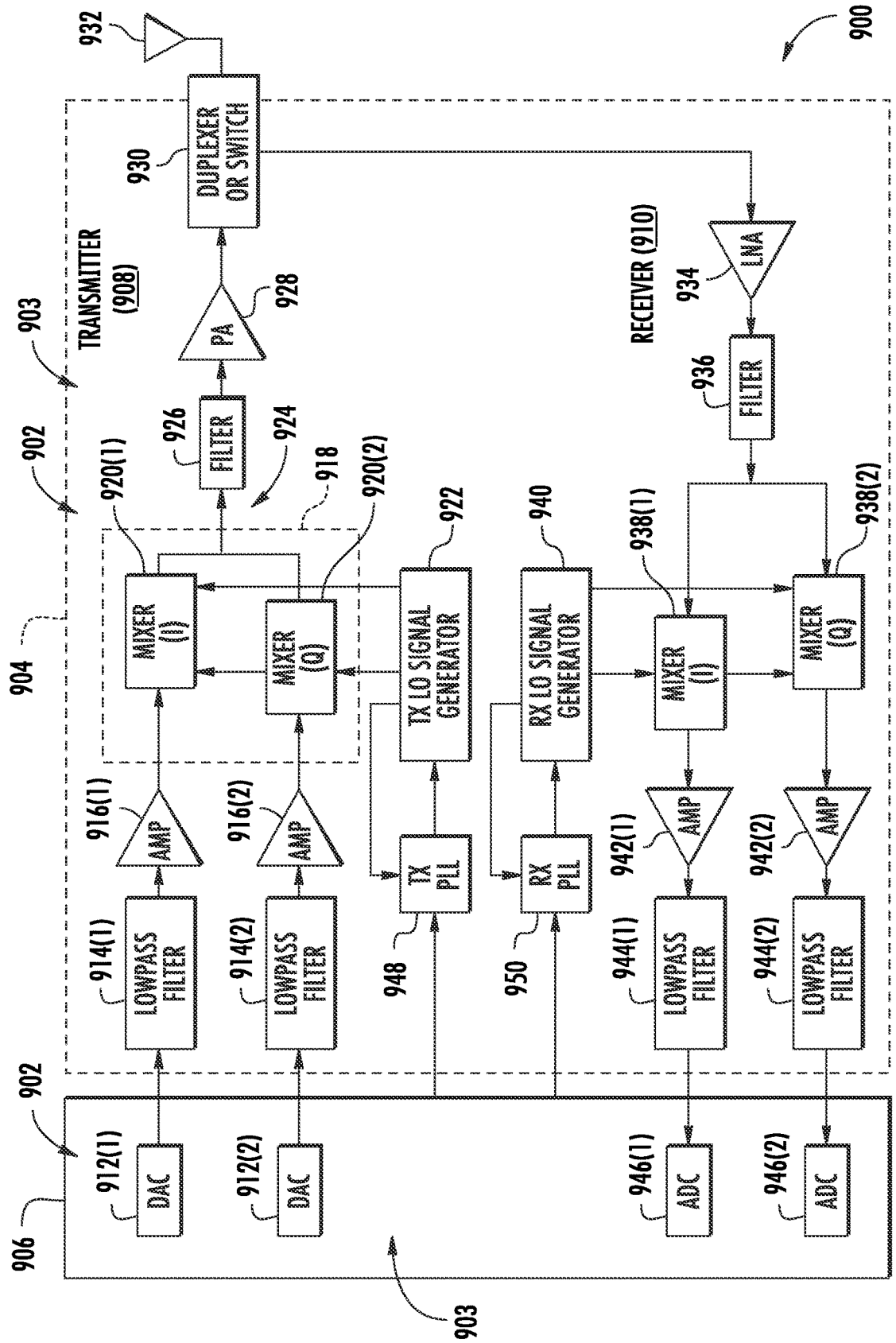
FIG. 9 is a block diagram of an exemplary wireless communication device that includes radio-frequency (RF) components that can include an IC package that includes a first die coupled to a first, outer surface of a package substrate, and further includes a wire bond channel that includes wire bonds extending from first metal pads coupled to the first die, to the second metal pads outside of the package substrate and over a signal routing KoZ in the package substrate in a second, vertical direction, to support more direct signal routing paths between the first die and the second metal pads, including but not limited to the IC packages in FIGS. 2A-2C, 4A-4B, and 7A-7F, and according to, but not limited to, any of the exemplary fabrication processes in FIGS. 5-6C.

FIG. 9 illustrates an exemplary wireless communications device 900 that includes radio-frequency (RF) components formed from one or more ICs 902, wherein any of the ICs 902 can be included in an IC package 903 that includes a first die coupled to a first, outer surface of a package substrate, and further includes a wire bond channel that includes wire bonds extending from first metal pads coupled to the first die to second metal pads outside of the package substrate and over a signal routing KoZ in the package substrate in a vertical direction, to support more direct signal routing paths between the first die and the second metal pads, including but not limited to the IC packages in FIGS. 2A-2C, 4A-4B, and 7A-7F, and according to, but not limited to, any of the exemplary fabrication processes in FIGS. 5-6C. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals (e.g., I and Q output currents) for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency up-conversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Down-conversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency up-conversion, while the RX LO signal generator 940 generates the I and Q RX LO signals used for frequency down-conversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
   a package substrate comprising a first surface extending in a first direction;
   a first die coupled to the first surface of the package substrate;
   a wire bond channel, comprising:
      one or more first metal pads coupled to the first surface of the package substrate and coupled to the first die;
      one or more second metal pads coupled to the first surface of the package substrate; and
      one or more wire bonds disposed outside the package substrate, the one or more wire bonds each coupling a respective first metal pad of the one or more first metal pads to a respective second metal pad of the one or more second metal pads.
2. The IC package of clause 1, wherein the one or more wire bonds extend over the first surface of the package substrate in a second direction orthogonal to the first direction.
3. The IC package of clause 1 or 2, further comprising a second electronic device coupled to the first surface of the package substrate, the second electronic device adjacent to the first die;
   wherein at least a portion of at least one of the one or more wire bonds intersect a first vertical plane intersecting the second electronic device.
4. The IC package of clause 3, wherein at least a portion of each of the one or more wire bonds intersects a vertical plane intersecting the second electronic device.
5. The IC package of clause 3 or 4, wherein:
   the second electronic device comprises a first side adjacent to the first die;
   the one or more first metal pads are disposed adjacent to the first die and between the first die and the first side of the second electronic device in the first direction; and
   the one or more second metal pads are disposed adjacent to a second side of the second electronic device.
6. The IC package of any of clauses 3 to 5, wherein:
   the package substrate further comprises an outer metallization layer adjacent to the first surface of the package substrate;
   the second electronic device is coupled to the outer metallization layer, and
   the outer metallization layer comprises a keep out zone (KoZ) region comprising or more first metal lines, wherein the KoZ region extends in the first direction and at least partially intersects a first plane orthogonal to the first direction.
7. The IC package of any of clauses 3 to 6, wherein the second electronic device comprises a second die.
8. The IC package of any of clauses 3 to 7, wherein the second electronic device comprises a deep trench capacitor.
9. The IC package of clause 1, wherein:
   the package substrate further comprises an outer metallization layer adjacent to
      the first surface of the package substrate, and
      the outer metallization layer comprising a keep out zone (KoZ) region comprising one or more first metal lines extending in the first direction; and
   at least a portion of at least one wire bond of the one or more wire bonds intersects a first vertical plane orthogonal to the first direction and intersecting at least a portion of the KoZ region.
10. The IC package of clause 9, wherein the IC package does not comprise a second electronic device coupled to the first surface of the package substrate that intersects the first vertical plane.
11. The IC package of clause 9 or 10, wherein:
    the outer metallization layer comprises one or more second metal lines coupled to the one or more first metal pads; and
    the first die is coupled to the one or more second metal lines.
12. The IC package of clause 11, wherein:
    the one or more second metal lines extend in a third direction towards the one or more first metal pads; and
    the one or more wire bonds extend in a fourth direction different from the third direction from the one or more first metal pads towards the one or more second metal pads.
13. The IC package of any of clauses 1 to 12, wherein:
    the one or more first metal pads are exposed from the first surface of the package substrate; and
    the one or more second metal pads are exposed from the first surface of the package substrate.
14. The IC package of any of clauses 1 to 13, wherein:
    the package substrate comprises a metallization layer comprising a plurality of metal lines;
    the one or more first metal pads are coupled to the plurality of metal lines; and
    the first die is coupled to the plurality of metal lines.
15. The IC package of any of clauses 1 to 14 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server, a computer; a portable computer, a mobile computing device; a wearable computing device; a desktop computer, a personal digital assistant (PDA); a monitor, a computer monitor, a television; a tuner; a radio; a satellite radio; a music player, a digital music player; a portable music player; a digital video player, a video player, a digital video disc (DVD) player; a portable digital video player, an automobile; a vehicle component; avionics systems; a drone; and a multicopter.

16. A method of fabricating an integrated circuit (IC) package, comprising:
providing a package substrate comprising a first surface extending in a first direction;
coupling a first die to the first surface of the package substrate; and
forming a wire bond channel, comprising:
forming one or more first metal pads coupled the first surface of the package substrate and coupled to the first die;
forming one or more second metal pads coupled to the first surface of the package substrate;
coupling a first end of each of one or more wire bonds outside the package substrate to the one or more first metal pads outside the package substrate; and
coupling a second end of each of the one or more wire bonds outside the package substrate to the one or more second metal pads.

17. The method of clause 16, further comprising extending the one or more wire bonds over the first surface of the package substrate in a second direction orthogonal to the first direction.

18. The method of clause 16 or 17, further comprising coupling a second electronic device to the first surface of the package substrate and adjacent to the first die;
wherein extending the one or more wire bonds further comprises extending the one or more wire bonds at least partially intersecting a first vertical plane intersecting the second electronic device.

19. The method of clause 18, wherein:
coupling the second electronic device to the first surface of the package substrate further comprises coupling a first side of the second electronic device adjacent to the first die;
forming the one or more first metal pads further comprises forming the one or more first metal pads adjacent to the first die and between the first die and the first side of the second electronic device in the first direction; and
forming the one or more second metal pads further comprises forming the one or more second metal pads adjacent to a second side of the second electronic device.

20. The method of clause 18 or 19, wherein:
the package substrate further comprises an outer metallization layer adjacent to the first surface of the package substrate, the outer metallization layer comprises a keep out zone (KoZ) region comprising one or more first metal lines, the KoZ region extending in the first direction; and
coupling the second electronic device to the first surface of the package substrate further comprises coupling the second electronic device to the outer metallization layer such that the second electronic device at least partially intersects the first vertical plane.

21. The method of clause 16 or 17, wherein:
the package substrate further comprises an outer metallization layer adjacent to the first surface of the package substrate, the outer metallization layer comprising a keep out zone (KoZ) region comprising one or more first metal lines extending in the first direction; and
extending the one or more wire bonds further comprises extending the one or more wire bonds at least partially intersecting a first vertical plane orthogonal to the first direction and intersecting at least a portion of the KoZ region.

22. The method of clause 21, further comprising not coupling a second electronic device to the first surface of the package substrate that intersects the first vertical plane.

23. The method of clause 21 or 22, wherein:
forming the one or more first metal pads further comprises coupling the one or more first metal pads to one or more second metal lines in the outer metallization layer; and
coupling the first die to the first surface of the package substrate further comprises coupling the first die to the one or more second metal lines.

24. The method of any of clauses 21 to 23, further comprising not coupling a second electronic device to the first surface of the package substrate that intersects the first vertical plane.

What is claimed is:

1. An integrated circuit (IC) package, comprising:
a package substrate comprising a first surface extending in a first direction;
a first die coupled to the first surface of the package substrate; and
a wire bond channel, comprising:
one or more first metal pads coupled to the first surface of the package substrate and coupled to the first die;
one or more second metal pads coupled to the first surface of the package substrate; and
one or more wire bonds disposed outside the package substrate, the one or more wire bonds each coupling a respective first metal pad of the one or more first metal pads to a respective second metal pad of the one or more second metal pads.

2. The IC package of claim 1, wherein the one or more wire bonds extend over the first surface of the package substrate in a second direction orthogonal to the first direction.

3. The IC package of claim 1, further comprising a second electronic device coupled to the first surface of the package substrate, the second electronic device adjacent to the first die;
wherein at least a portion of at least one of the one or more wire bonds intersect a first vertical plane intersecting the second electronic device.

4. The IC package of claim 3, wherein at least a portion of each of the one or more wire bonds intersects a vertical plane intersecting the second electronic device.

5. The IC package of claim 3, wherein:
the second electronic device comprises a first side adjacent to the first die;
the one or more first metal pads are disposed adjacent to the first die and between the first die and the first side of the second electronic device in the first direction; and
the one or more second metal pads are disposed adjacent to a second side of the second electronic device.

6. The IC package of claim 3, wherein:
the package substrate further comprises an outer metallization layer adjacent to the first surface of the package substrate;
the second electronic device is coupled to the outer metallization layer; and the outer metallization layer comprises a keep out zone (KoZ) region comprising or more first metal lines, wherein the KoZ region extends in the first direction and at least partially intersects a first plane orthogonal to the first direction.

7. The IC package of claim 3, wherein the second electronic device comprises a second die.

8. The IC package of claim 3, wherein the second electronic device comprises a deep trench capacitor.

9. The IC package of claim 1, wherein:
the package substrate further comprises:
an outer metallization layer adjacent to the first surface of the package substrate, the outer metallization layer comprises:
a keep out zone (KoZ) region, the KoZ region comprising one or more first metal lines extending in the first direction; and
at least a portion of at least one wire bond of the one or more wire bonds intersects a first vertical plane orthogonal to the first direction and intersecting at least a portion of the KoZ region.

10. The IC package of claim 9, wherein the IC package does not comprise a second electronic device coupled to the first surface of the package substrate that intersects the first vertical plane.

11. The IC package of claim 9, wherein:
the outer metallization layer comprises one or more second metal lines coupled to the one or more first metal pads; and
the first die is coupled to the one or more second metal lines.

12. The IC package of claim 11, wherein:
the one or more second metal lines extend in a third direction towards the one or more first metal pads; and
the one or more wire bonds extend in a fourth direction different from the third direction from the one or more first metal pads towards the one or more second metal pads.

13. The IC package of claim 1, wherein:
the one or more first metal pads are exposed from the first surface of the package substrate; and
the one or more second metal pads are exposed from the first surface of the package substrate.

14. The IC package of claim 1, wherein:
the package substrate comprises a metallization layer comprising a plurality of metal lines;
the one or more first metal pads are each coupled to a respective one of the plurality of metal lines; and
the first die is coupled to the plurality of metal lines.

15. A method of fabricating an integrated circuit (IC) package, comprising:
providing a package substrate comprising a first surface extending in a first direction;
coupling a first die to the first surface of the package substrate; and
forming a wire bond channel, comprising:
forming one or more first metal pads coupled the first surface of the package substrate and coupled to the first die;
forming one or more second metal pads coupled to the first surface of the package substrate;
coupling a first end of each of one or more wire bonds outside the package substrate to the one or more first metal pads outside the package substrate; and
coupling a second end of each of the one or more wire bonds outside the package substrate to the one or more second metal pads.

16. The method of claim 15, further comprising extending the one or more wire bonds over the first surface of the package substrate in a second direction orthogonal to the first direction.

17. The method of claim 15, further comprising:
coupling a second electronic device to the first surface of the package substrate and adjacent to the first die; and
extending the one or more wire bonds intersecting a first vertical plane intersecting the second electronic device.

18. The method of claim 17, wherein:
the coupling the second electronic device to the first surface of the package substrate further comprises coupling a first side of the second electronic device adjacent to the first die;
the forming the one or more first metal pads further comprises forming the one or more first metal pads adjacent to the first die and between the first die and the first side of the second electronic device in the first direction; and
the forming the one or more second metal pads further comprises forming the one or more second metal pads adjacent to a second side of the second electronic device.

19. The method of claim 17, wherein:
the package substrate further comprises an outer metallization layer adjacent to the first surface of the package substrate, the outer metallization layer comprises a keep out zone (KoZ) region comprising one or more first metal lines, the KoZ region extending in the first direction; and
the coupling the second electronic device to the first surface of the package substrate further comprises coupling the second electronic device to the outer metallization layer such that the second electronic device at least partially intersects the first vertical plane.

20. The method of claim 15, wherein:
the package substrate further comprises an outer metallization layer adjacent to the first surface of the package substrate, the outer metallization layer comprises a keep out zone (KoZ) region comprising one or more first metal lines extending in the first direction; and
the method further comprising:
extending the one or more wire bonds intersecting a first vertical plane orthogonal to the first direction and intersecting at least a portion of the KoZ region.

21. The method of claim 20, further comprising not coupling a second electronic device to the first surface of the package substrate that intersects the first vertical plane.

22. The method of claim 20, wherein:
the forming the one or more first metal pads further comprises coupling the one or more first metal pads to one or more second metal lines in the outer metallization layer; and
the coupling the first die to the first surface of the package substrate further comprises coupling the first die to the one or more second metal lines.

23. The method of claim 20, further comprising not coupling a second electronic device to the first surface of the package substrate that intersects the first vertical plane.

* * * * *